United States Patent [19]

Alpaugh et al.

[11] 4,152,467
[45] May 1, 1979

[54] ELECTROLESS COPPER PLATING PROCESS WITH DISSOLVED OXYGEN MAINTAINED IN BATH

[75] Inventors: Warren A. Alpaugh, Chenango Forks; Theodore D. Zucconi, Endicott, both of N.Y.

[73] Assignee: International Business Machines Corporation, Armonk, N.Y.

[21] Appl. No.: 885,415

[22] Filed: Mar. 10, 1978

[51] Int. Cl.² ............................................. C23C 3/02
[52] U.S. Cl. ...................................... 427/8; 106/1.26; 106/23; 427/97; 427/98; 427/345; 427/430 A; 427/437
[58] Field of Search ................... 427/430 A, 437, 345, 427/8, 97, 98; 106/1.23

[56] References Cited

U.S. PATENT DOCUMENTS

| | | | |
|---|---|---|---|
| 2,938,805 | 5/1960 | Agens | 106/1.26 |
| 3,300,335 | 1/1967 | Horvath | 427/430 A |
| 3,348,969 | 10/1967 | Katz | 427/430 A |
| 3,895,137 | 7/1975 | Avramidis | 427/295 |
| 3,900,599 | 8/1975 | Feldstein | 427/97 |
| 3,959,531 | 5/1976 | Schneble et al. | 427/345 |

Primary Examiner—John D. Smith
Attorney, Agent, or Firm—Pollock, Vande Sande & Priddy

[57] ABSTRACT

Copper is electrolessly deposited on a surface wherein the dissolved oxygen content is maintained between 2 and 4 ppm in the plating bath.

21 Claims, 1 Drawing Figure

ELECTROLESS COPPER PLATING PROCESS WITH DISSOLVED OXYGEN MAINTAINED IN BATH

FIELD OF THE INVENTION

The present invention is concerned with a process for electroless copper plating. In particular, the present invention is concerned with a process for producing high quality copper plating. Materials made according to the process of the present invention have such high quality that they are suitable, for instance, in printed circuit applications where extremely high reliability is absolutely essential. The process of the present invention is characterized by careful control of the dissolved oxygen content in the plating bath during the plating operation.

BACKGROUND OF THE INVENTION

Electroless copper plating per se is well known in the prior art. An electroless or autocatalytic copper plating bath usually contains a cupric salt, a reducing agent for the cupric salt, a chelating or complexing agent and a pH adjuster. In addition, if the surface being plated is not already catalytic for the deposition of the copper, a suitable catalyst is deposited on the surface prior to contact with the copper plating bath. Among the more widely employed procedures for catalyzing a substrate is the use of a stannous chloride sensitizing solution and a palladium chloride activator to form a layer of metallic palladium particles.

In addition, during the plating, the bath is generally agitated to maintain the stability of the bath and to assist in dislodging hydrogen bubbles that tend to form on the surface of the substrate being plated. One means to provide agitation is by bubbling an oxygen containing gas such as air as exemplified by U.S. Pat. No. 2,938,805 to Agens through the bath.

Although the technology relative to electroless copper plating is continually being improved whereby copper coatings having the ability to withstand severe mechanical testing without electrical or mechanical failure by cracking as exemplified by U.S. Pat. No. 3,844,799 to Underkofler and Zucconi has occurred over the last few years, certain problems still exist. Certain problems are particularly pronounced when preparing articles of very high quality such as those to be employed in printed circuit applications, e.g., printed circuit boards which contain high density circuitry and large numbers of holes such as through holes and blind holes. The problems encountered include the formation of voids in the coatings located in the holes. This in turn can cause unreliable electrical connections in the holes. In addition, even if the electrical connections initially are adequate, the presence of voids tend to cause the coatings within the holes to crack during use of the circuits. During operation, integrated circuit boards tend to expand and contract somewhat. Any discontinuities in the coating represent a prime site for cracking due to the mechanical stress from such expansion and contraction.

In addition, a major reason for yield loss in electroless plating is the formation of what is known as extranious copper or nodules. The formation of nodules in unwanted areas on a substrate can result in short circuiting by forming contact between circuit lines on the substrate. In addition, such processes as providing protective coatings providing solder and pin insertion are adversely affected by the presence of nodules on the surface.

Accordingly, the present invention provides an improved electroless copper plating process which significantly reduces, if not substantially eliminates, the presence of voids within the holes of a substrate. In addition, the present invention significantly reduces, if not entirely eliminates, the formation of nodules on the surface of the substrate.

In manufacturing printed circuits, usually an initial electroless plating operation is employed which is generally referred to as a strike bath followed by a subsequent electroless plating employing the main bath or followed by a subsequent electrodeposition plating process in order to obtain the desired thickness of the copper layer. The strike bath is formulated in order to promote the initial copper plating on the catalytic surfaces. Generally, the substrates are subjected to a strike bath for about 1 hour and then transferred to the main additive electroless copper plating bath for an additional 15 to 20 hours. The strike bath is formulated by design to be much more chemically active than the main additive bath. The use of a strike bath is disadvantageous from an economical standpoint since it requires the preparation of two separate baths for the coating process. Also, since the strike bath is more chemically reactive than the main bath, it is more difficult to control thereby contributing to the yield loss of the coated substrates.

The present invention makes it possible to eliminate the strike bath. The process of the present invention makes it possible to use only one bath which both initiates the plating and is used as the main plating bath in a continuous plating operation. The above advantages are achieved without sacrificing the stability of the plating bath.

It has been found according to the present invention that by careful control of the dissolved oxygen level in the plating bath during plating, that the above objectives and advantages are achieved. As mentioned hereinabove, the use of oxygen in plating baths has previously been suggested. However, it has not heretofore been recognized that a control of a particular range of dissolved oxygen in the plating bath would result in the advantages achieved by the present invention. In fact, the discussions in the prior art concerning the use of oxygen actually lead away from the present invention.

For instance, U.S. Pat. No. 2,938,805 to Agens suggests aerating a copper electroless plating bath by employing an oxygen-containing gas which can be diluted with any inert gas such as nitrogen. This patent does not suggest employing the particular amounts of dissolved oxygen in the bath which are necessary to achieve the results of the present invention. In fact, this patent suggests that no advantage would be obtained in using a gas containing less than the about 20% oxygen in air (along these lines, see column 3, lines 63–67).

U.S. Pat. No. 3,900,599 to Feldstein suggests removing as much as possible of oxygen from a plating bath prior to the plating operation. In addition, Example 2 of said patent clearly indicates that air agitation should not be carried out in order to avoid plating skips. It is noted that the electroless plating baths actually employed by Feldstein are flash or strike electroless baths since subsequent electrodeposition is contemplated (see column 1, lines 65 et seq. of Feldstein). Furthermore, the plating baths explicitly suggested in Feldstein are not affected by the presence of nitrogen whereas the use of nitrogen alone in the main plating bath can adversely affect its stability. Accordingly, Feldstein, as well as U.S. Pat. Nos. 3,666,527 to Feldstein and 3,454,416 to Heymann et al, actually suggest that oxygen should not be deliberately or purposely introduced during the electroless plating of copper.

Horvath et al in U.S. Pat. No. 3,300,335 suggest foaming an electroless plating bath prior to contacting it with the substrate to be plated by employing a gas which can be air or an inert gas such as nitrogen. Again, Horvath et al fail to suggest maintaining the oxygen level at the values required by the present invention in order to achieve the results obtained herein.

Discussions of the affect of oxygen with respect to nickel plating can be found, for instance, in Chemical Abstracts, Volume 76, page 62385g and Chemical Abstracts, Volume 72, page 92799e. In addition, the use of certain light inert gases such as hydrogen, helium, methane, or neon in electroless nickel plating is discussed in U.S. Pat. No. 2,819,188 to Metheny et al.

SUMMARY OF THE INVENTION

The present invention is concerned with a process for electrolessly depositing copper on a substrate which is catalytic for the deposition of the copper. The process comprises contacting the surface to be plated with a copper plating bath while maintaining the dissolved oxygen within a certain range in the plating bath during the plating. The amount of oxygen must be between 2 and 4 ppm.

BRIEF DESCRIPTION OF THE DRAWING

The FIGURE is a schematic diagram of a plating tank suitable for carrying out the process of the present invention.

DESCRIPTION OF PREFERRED EMBODIMENTS

Figure 1:
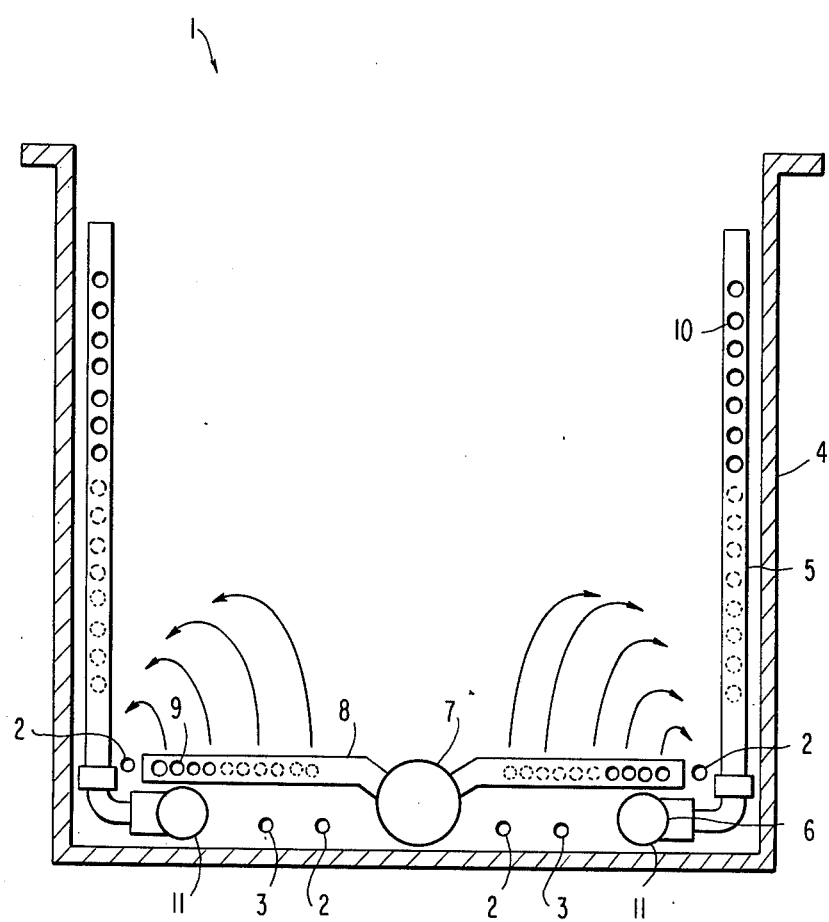

According to the present invention, it has been found that improved products can be obtained by maintaining the level of dissolved oxygen in a copper electroless plating bath between 2 and 4 ppm, and preferably between 2.5 and 3.5 ppm during the plating process. These amounts of dissolved oxygen are below the saturation level of dissolved oxygen obtained by using air. By maintaining the dissolved oxygen level in this range, the formation of voids in the coating and particularly in holes in the substrate is significantly reduced if not completely eliminated, and the formation of nodules on the surface of the substrate is also significantly reduced.

In addition, the process of the present invention makes it possible to employ only one bath both to initiate and to provide for continuous plating of the desired substrates. According to the present invention, the necessity for a strike or flash bath is eliminated. Of course, if desired, one could still use a flash or strike bath. The process of the present invention also results in short take times (e.g., times for plating of the initial thickness of coating in the holes). For instance, take time of many processes according to the present invention were 5 minutes or less.

The proper level of oxygen is preferably maintained during the plating by introducing into the plating tank a mixture of oxygen and an inert gas. The amount of oxygen in the mixture is such that there will be less than the amount of oxygen dissolved in the bath than if the bath were aerated with air alone. For instance, if nitrogen is employed as the inert gas, then the amount of oxygen in the mixture would be less than the amount normally found in air.

The oxygen portion of the mixture can be from pure oxygen or preferably from air primarily because of economics. Mixed with the air or oxygen is an inert gas such as hydrogen, nitrogen, argon, neon, krypton, and the like. The preferred inert gas is nitrogen. Mixtures of inert gases can be used. The relative amount of inert gas and oxygen will depend upon the relative solubilities of oxygen and the inert gas in water at the temperature of operation of the electroless bath in order to obtain the desired amount of oxygen in the bath. For instance, with nitrogen as the inert gas in admixture with air, at a plating temperature of 73° C.±0.5° C., 14 SCFM (standard cubic feet per minute) per 1000 gallons of bath of air and between about 0.7 to about 1 of SCFM per 1000 gallons of bath of nitrogen provided $O_2$ levels between about 2.5 and 3.5 ppm. The saturation level of oxygen at 73° C. in the bath due to aeration with only air would be about 5 to 5.5 ppm. The saturation level of oxygen decreases with increasing temperatures.

The inert gas is preferably premixed with the oxygen or air prior to introduction into the bath. However, the individual gases can be introduced into the bath separately if desired.

In addition to including the required level of dissolved oxygen, the copper electroless plating bath is generally an aqueous composition which includes a source of cupric ion, a reducing agent, a complexing agent for the cupric ion, and a pH adjuster. The plating baths employed according to the present invention also preferably include a cyanide ion source and a surface-active agent.

The cupric ion source generally used is a cupric sulfate or a cupric salt of the complexing agent to be employed. When employing cupric sulfate, it is preferred to use amounts from about 3 to about 15 grams/liter and most preferably from about 8 to about 12 grams/liter. The most common reducing agent employed is formaldehyde which in the preferred aspects of the present invention is used in amounts from about 0.7 to about 7 grams per liter and most preferably from about 0.7 to about 2.2 grams per liter. Examples of some other reducing agents include formaldehyde procursors or derivatives such as paraformaldehyde, trioxane, dimethyl hydantoin, glyoxal; borohydrides such as alkali metal borohydrides (sodium and potassium borohydride) and substituted borohydrides such as sodium trimethoxy borohydride; boranes such as amine borane (isopropyl amine borane and morpholine borane).

Examples of some suitable complexing agents include Rochelle salts, ethylene diamine tetraacetic acid, the sodium (mono-, di-, tri-, and tetra-sodium) salts of ethylene diamine tetraacetic acid, nitrilo triacetic acid and its alkali salts, gluconic acid, gluconates, triethanol amine, glucono-(gamma)-lactone, modified ethylene diamine acetates such as N-hydroxyethyl ethylene diamine triacetate. In addition, a number of other suitable cuprix complexing agents are suggested in U.S. Pat. Nos. 2,996,408, 3,075,856, 3,075,855, and 2,938,805. The amount of complexing agent is dependent upon the amount of cupric ions present in the solution and is generally from about 20 to about 50 grams/liter, on in a 3-4 fold molar excess.

The plating bath can also contain a surfactant which assists in helping to wet the surface to be coated. A satisfactory surfactant is, for instance, an organic phosphate ester available under the trade designation Gafac RE-610. Generally, the surfactant is present in amounts from about 0.02 to about 0.3 grams/liter. In addition, the pH of the bath is also generally controlled, for instance, by the addition of a basic compound such as sodium hydroxide or potassium hydroxide in the desired amount to achieve the desired pH. According to a preferred aspect of the present invention, the pH of the electroless plating bath is between 11.6 and 11.8.

According to the preferred aspect of the present invention, the plating bath also contains a cyanide ion and most preferably contains about 10 to about 25 miligrams per liter to provide a cyanide ion concentration in the bath within the range of 0.0002 to 0.0004 molar. Examples of some cyanides which can be employed according to the present invention are the alkali metal, alkaline earth metal, and ammonium cyanides such as sodium, potassium, calcium, and ammonium cyanide. In addition, the plating baths can include other minor additives as is well known in the prior art.

The preferred plating baths employed according to the present invention have a specific gravity within the range of 1.060 to 1.080. In addition, the temperature of the bath, according to the preferred aspects of the present invention, is maintained between 70° and 80° C. and preferably between 70° and 75° C. For a discussion of the preferred plating temperatures coupled with the preferred cyanide ion concentrations, see U.S. Pat. No. 3,844,799.

The overall flow rate of the gases into the bath is generally from about 1 to about 20 SCFM per 1000 gallons of bath and preferably from about 3 to about 8 SCFM per 1000 gallons of bath. Of course, the flow rate can be scaled up or down depending upon the bath size. At the lower flow rates, increased recycling of bath is usually desired. Because of the use of the additional quantities of inert gas, the flow rate of the gases can be quite high without increasing the oxygen level. The use of relatively high flow rates is desirably for preventing the bath from becoming unstable. Also, the use of an inert gas in conjunction with the oxygen provides a means for maintaining the proper oxygen level during substantially the entire plating even though dynamic changes in the bath take place.

The plating rate achieved by the present invention is generally between about 0.06 to 0.15 mil/hour and the bath loading is between about 20 and about 200 $cm^2/l$. The oxygen level can be intermittently or continuously measured by any of the well known means to measure dissolved oxygen content. One particular type of apparatus is commercially available under the trade designation YSI Model 57 Series, Dissolved Oxygen Meter from the Scientific Division of Yellow Springs Instrument Company.

If the level of oxygen falls outside of the required range, the gas mixture is adjusted to bring the level back to the required amount. For example, if the amount of oxygen falls below 2 ppm, the amount of oxygen in the mixture would be increased, and conversely if the amount of oxygen goes above 4 ppm, then the amount of inert gas in the mixture would be increased. Moreover, the bath if desired can be monitored for other parameters of the system (e.g., pH, temperature, specific gravity, cyanide content) and when needed be adjusted.

The process of the present invention can be carried out continuously whereby the bath is replenished with needed chemicals and any bath overflowing is recycled back into the plating tank after reclaimation.

The following examples and table illustrate the critical affect of the dissolved oxygen content on the copper deposition. Epoxy-fiberglass laminates having through holes and being seeded with stannous chloride and palladium chloride to provide a palladium metal seed on selected portions thereof are contacted with an electroless plating bath containing 10 grams per liter of $CuSO_4\cdot 5H_2O$ grams per liter of ethylene diamine tetraacetic acid dihydrate, 0.25 grams per liter of Gafac RE-610, 14 milligrams per liter sodium cyanide, 2 ml/l 37% HCHO, and varying amounts of dissolved oxygen as stated in the table below. The specific gravity of the plating bath is 1.07, the pH is 11.70 by the addition of NaOH, and the temperature of the bath is 73° C. ±0.5° C. The varying mixtures of gases to obtain the recorded levels of oxygen in the bath is introduced by premixing nitrogen with air prior to introduction into the bath. The flow rate is about 12 SCFM which also provided mixing and agitation of the bath. In addition, the plating racks are continuously agitated during the plating.

Table I

| No. | Dissolved $O_2$ ppm | Take time minutes | Voids | Type of plating |
|---|---|---|---|---|
| 1 | 2.8–3.2 | 5 minutes | None | Thick |
| 2 | 3.5 | 5 minutes | None | Thick |
| 3 | 3.5–3.7 | 5 minutes | Small amount voids | Thinner than Run 2 |
| 4 | 3.7 | 5 minutes | Small amount voids | Somewhat thinner than 3 |
| 5 | 4.5 | 20 minutes | Large number of voids | Thin coating |
| 6 | 2.9 | 5 minutes | No | Thick |
| 7 | 2.4 | 5 minutes | No | Thick |
| 8 | 2.8 | 10 minutes | No | Thick |
| 9 | 2.3 | 5 minutes | No | Thick |
| 10 | 3.2 | 5 minutes | No | Thick |
| 11 | 3.1 | 5 minutes | No | Thick |

A comparison of the oxygen contents within the range required by the present invention and those outside the scope of the present invention in Table I above clearly illustrates the improved properties achieved by the present invention. In particular, the take times were much less when operating within the range required by the present invention as compared to amounts outside of said range. In addition, the amount of voids significantly increases when the amounts of dissolved oxygen are greater than 4 ppm. It is further noted that if the oxygen level falls below 2 ppm, the amount of undesired nodules on the surface significantly increases. Moreover, by operating within the required oxygen levels, the desired thicknesses for the coating are readily achieved and high plating rates are also possible.

It is surprising that the addition of relatively small amounts of inert gas such as the nitrogen as compared to employing air alone has such a significant affect. For instance, the percentage of nitrogen in air is approximately 80% whereas if 1 SCFM of nitrogen to 14 SCFM of air is premixed which is suitable according to the present invention, then the amount of nitrogen is about 81.35% or an additional 1.35% and amount of oxygen is 18.65%. However, the results obtained are quite noticeable as exemplified hereinabove.

Reference to the FIGURE schematically illustrates a tank generally referred to as 1 suitable for carrying out the process of the present invention. Tank 1 includes closure walls 4. Air or oxygen is injected into the bath via conduits 2 and premixed nitrogen and air is injected into the bath via conduits 3. In addition, the tank is provided with a chemical feed means 8 which includes a pipe 7 for introduction of chemicals and holes 9 for exiting of the chemicals into the tank. Also included are recycle lines 5 which include a multiplicity of holes 10 through which chemicals are removed from the bath and are conveyed to a filter means (not shown) via conduits 11. This material, after it is filtered, can be collected and recycled back into the tank via conduit 7.

What is claimed is:

1. A process for electrolessly depositing copper on a surface which is catalytic for the deposition of copper which comprises contacting the surface to be plated with a copper plating bath and maintaining during the plating a level of dissolved $O_2$ in the bath between 2 and 4 ppm.

2. The process of claim 1 wherein the predetermined level of the dissolved oxygen in the bath is between 2.5 and 3.5 ppm.

3. The process of claim 1 wherein the temperature of the bath is between 70° and 80° C.

4. The process of claim 1 wherein the temperature of the bath is between 70° and 75° C.

5. The process of claim 1 wherein the temperature of the bath is maintained within 0.5° of 73° C.

6. The process of claim 1 wherein the pH of the bath is maintained within the range of 11.6 and 11.8.

7. The process of claim 1 wherein the electroless process is a continuous process.

8. The process of claim 1 wherein the specific gravity of the bath is between 1.060 and 1.080.

9. The process of claim 1 wherein the plating bath comprises a source of cupric ions, a reducing agent for said cupric ions, a surfactant, a complexing agent for cupric ions, and a source of cyanide ions.

10. The process of claim 9 wherein the bath is maintained continuously between 70° and 80° C. during the plating and the bath is adjusted to maintain continuously a cyanide ion concentration within the range of 0.0002 to 0.0004 molar.

11. The process of claim 1 wherein said plating bath comprises 3 to 15 grams per liter of cupric ion source, 0.7 to 7 grams per liter of a reducing agent, 0.02 to 0.3 grams per liter of a surface-active agent, 20 to 50 grams per liter of a complexing agent for the cupric ion, 10 to 25 mg per liter of cyanide ion, a pH of 11.6–11.8, and a specific gravity of 1.060 to 1.080, and wherein the bath is maintained at a temperature of 70° to 80° C.

12. The process of claim 11 wherein the reducing agent is formaldehyde.

13. The process of claim 11 wherein the complexing agent is ethylene diamine tetraacetic acid.

14. The process of claim 11 wherein the surfactant is an organic phosphate ester.

15. The process of claim 1 wherein the amount of dissolved oxygen is maintained by introducing into the bath a mixture of oxygen-containing gas and an inert gas wherein the amount of oxygen in the mixture is such that there will be less than that amount of oxygen dissolved in the bath than would be present if the bath were aerated with air alone.

16. The process of claim 15 wherein the flow rate of said mixture is between about 1 and 20 SCFM per 1000 gallons of bath.

17. The process of claim 15 wherein the flow rate of said mixture is between 3 and 8 SCFM per 1000 gallons of bath.

18. The process of claim 15 wherein the oxygen-containing gas is air.

19. The process of claim 15 wherein said inert gas is selected from the group consisting of hydrogen, nitrogen, argon, neon, krypton, and mixtures thereof.

20. The process of claim 15 wherein said inert gas is nitrogen.

21. The process of claim 1 wherein the oxygen level of the bath is measured during the plating.

* * * * *

UNITED STATES PATENT AND TRADEMARK OFFICE
CERTIFICATE OF CORRECTION

PATENT NO. : 4,152,467
DATED : May 1, 1979
INVENTOR(S) : Warren A. Alpaugh and Theodore D. Zucconi It is certified that error appears in the above-identified patent and that said Letters Patent are hereby corrected as shown below:

Column 4, line 63, change "on" to --or--.

Column 5, line 38, change "desirably" to --desirable--.

Column 6, line 8, after "$5H_2O$," insert --,35--.

Signed and Sealed this

Eleventh Day of September 1979

[SEAL]

Attest:

Attesting Officer

LUTRELLE F. PARKER
Acting Commissioner of Patents and Trademarks